United States Patent [19]
Mori et al.

[11] Patent Number: 5,323,348
[45] Date of Patent: Jun. 21, 1994

[54] SEMICONDUCTOR MEMORY DEVICE HAVING MULTIPLE MEMORY ARRAYS AND INCLUDING REDUNDANCY CIRCUIT FOR REPAIRING A FAULTY BIT

[75] Inventors: Shigeru Mori; Yoshikazu Morooka; Hiroshi Miyamoto; Mitsuya Kinoshita; Makoto Suwa; Shigeru Kikuda; Michihiro Yamada, all of Hyogo, Japan

[73] Assignee: Mitsubishi Denki Kabushiki Kaisha, Tokyo, Japan

[21] Appl. No.: 767,316

[22] Filed: Sep. 30, 1991

[30] Foreign Application Priority Data

Oct. 3, 1990 [JP] Japan .................. 2-267016

[51] Int. Cl.$^5$ .............................................. G11C 7/00
[52] U.S. Cl. ................................ 365/200; 365/230.03
[58] Field of Search ............... 365/200, 230.03, 230.04, 365/230.06; 371/10.2, 10.3

[56] References Cited

U.S. PATENT DOCUMENTS

| | | | |
|---|---|---|---|
| 4,528,647 | 7/1985 | Chamberlain | 365/230.03 |
| 4,672,581 | 6/1987 | Waller | 365/200 |
| 4,688,219 | 8/1987 | Takemae | 371/10.3 |
| 4,691,301 | 9/1987 | Anderson | 365/200 |
| 4,766,573 | 8/1988 | Takemae | 365/200 |
| 4,768,193 | 8/1988 | Takemae | 371/10.3 |
| 4,811,298 | 3/1989 | Helwig et al. | 365/200 |
| 4,823,252 | 4/1989 | Horst et al. | 365/200 |
| 4,899,067 | 2/1990 | So et al. | 307/465 |
| 4,982,372 | 1/1991 | Matsuo | 365/230.04 |
| 5,134,585 | 7/1992 | Murakami et al. | 365/200 |

FOREIGN PATENT DOCUMENTS

| | | | |
|---|---|---|---|
| 57-198600 | 12/1982 | Japan | 371/10.3 |
| 58-222497 | 12/1983 | Japan | 371/10.3 |

Primary Examiner—Eugene R. LaRoche
Assistant Examiner—Son Dinh
Attorney, Agent, or Firm—Lowe, Price, LeBlanc & Becker

[57] ABSTRACT

Column repairing circuits 7a, 7b for repairing a DRAM in which there are defective memory cells in two columns are disclosed. The connection state of switching elements or circuits 51-5n, 61-6n, 71-7 (n+1), 81-8 (n+1) is determined as illustrated by appropriately disconnecting fuses in fuse links provided respectively in circuits 7a, 7b. Accordingly, column selecting lines Y2a and Y (n+1) b in memory array blocks 891a, 891b are not activated. The two repairing circuits 7a, 7b are provided spaced apart from each other on a semiconductor substrate, so that excessive concentration of fuse elements and switching elements or circuits is prevented.

9 Claims, 8 Drawing Sheets

SEMICONDUCTOR MEMORY DEVICE HAVING MULTIPLE MEMORY ARRAYS AND INCLUDING REDUNDANCY CIRCUIT FOR REPAIRING A FAULTY BIT

BACKGROUND OF THE INVENTION

Cross-Reference to Related, Copending Application

Related, copending applications of particular interest to the instant application are U.S. Ser. No. 500,965, filed on Mar. 29, 1990 and Ser. No. 617,737, filed on Nov. 26, 1990 and assigned to the same assignee of the instant application.

FIELD OF THE INVENTION

The present invention generally relates to semiconductor memory devices, and, more particularly, to a semiconductor memory device including a redundancy circuit for repairing a faulty bit. The present invention has particular applicability to dynamic random access memories (DRAMs).

DESCRIPTION OF THE BACKGROUND ART

A semiconductor memory such as a dynamic random access memory (hereinafter referred to as "DRAM") or static random access memory (hereinafter referred to as "SRAM") is generally provided with a redundancy circuit in order to enhance the yield in manufacture. When a manufactured semiconductor memory includes a defective memory cell, the semiconductor memory is repaired by the function of the redundancy circuit.

According to a conventional method, a row or column including a defective memory cell in a redundancy circuit is replaced with a predetermined (or fixed) spare row or column. According to another method, an extra number of rows or columns are prepared in a memory cell array, and the row or column including a defective memory cell is not selected by a decoder. Two preceding pending applications (U.S. application Ser. Nos. 500,965 and 617,737) already filed and assigned to the same assignee of the present application make several proposals with respect to methods of this type. Japanese Patent Laying-Open No. 61-61300 (1986) also shows an example of prior art according to the latter method.

Figure 1:
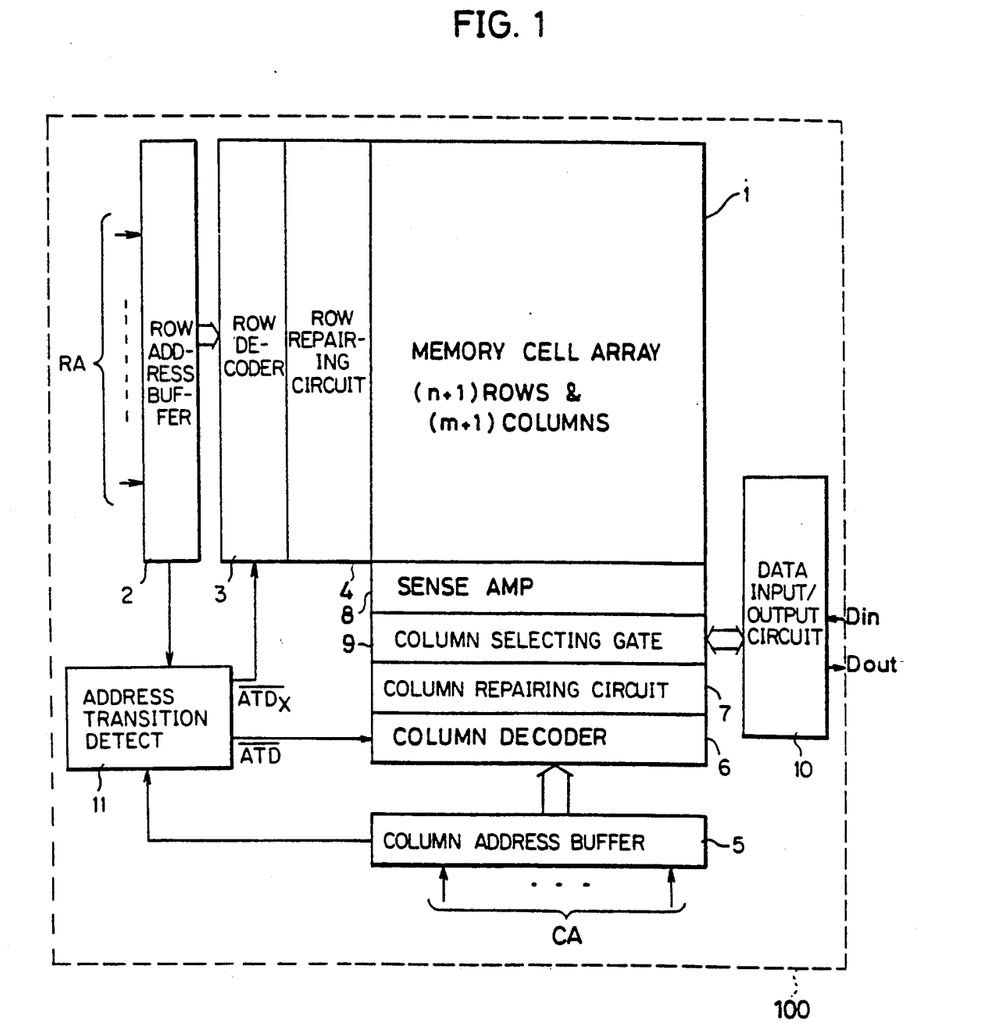
FIG. 1 is a block diagram of a general semiconductor memory illustrating the background of the present invention.

FIG. 1 is a block diagram of a general semiconductor memory illustrating the background of the present invention. A semiconductor memory 100 illustrated in FIG. 1 is disclosed in the above-described two preceding applications. Semiconductor memory 100 includes a memory cell array 1 in which memory cells are arranged in a matrix of (n+1) rows and (m+1) columns. As described in detail in the following, memory cell array 1 includes a redundancy row and a redundancy column whose positions are not fixed.

A row address buffer 2, a row decoder 3, and a row repairing circuit 4 are provided for selecting a row in memory cell array 1. Row address buffer 2 receives an externally applied row address signal RA and generates an internal row address signal. Row decoder 3 decodes the internal row address signal applied from row address buffer 2, selects one row in memory cell array 1, and applies an activating signal to the selected row.

Row repairing circuit 4 is provided between row decoder 3 and memory cell array 1 and applies the output of row decoder 3 to respective rows in memory cell array 1 so that a faulty row is always in a non-selected state.

A column address buffer 5, a column decoder 6, a column repairing circuit 7, a sense amplifier 8, and a column selecting gate 9 are provided for selecting a column in memory cell array 1. Column address buffer 5 receives an externally applied column address signal CA and generates an internal column address signal. Column decoder 6 decodes the internal column address signal from column address buffer 5 and generates a signal selecting one column in memory cell array 1.

Column repairing circuit 7 always keeps a faulty column in a non-selected state and applies the output of column decoder 6 to column selecting gate 9. Column selecting gate 9 is responsive to column selecting signals applied from column repairing circuit 7 to connect one selected column in memory cell array 1 to an IO line not shown.

Sense amplifier 8 amplifies the date signals stored in the memory cells in the row selected by row decoder 3.

A data input/output circuit 10 is provided for inputting/outputting data to be stored or stored to/from an external device. Data input/output circuit 10 receives an externally applied input data Din and transmits it through the IO line (not shown) and column selecting gate 8 to the selected memory cell. Data input/output circuit 10 receives the data signals amplified by sense amplifier 8 and provides them as output data Dout to the outside.

An address transition detecting circuit 11 is provided for defining timing of row selection and column selection in semiconductor memory 100. Address transition detecting circuit 11 monitors the internal row address signal from row address buffer 2, and generates a row address transition detecting signal ATDx in response to the timing of transition. Address transition detecting circuit 11 receives the internal column address signal from column address buffer 5 and provides a column address transition detecting signal ATDy in response to the timing of transition.

A general semiconductor memory 100 is illustrated in FIG. 1, and it is pointed that a DRAM or a SRAM or the like can be applied as semiconductor memory 100. In addition, it is pointed out that a broken-line block 100 illustrated in FIG. 1 also indicates a semiconductor chip.

Figure 2:
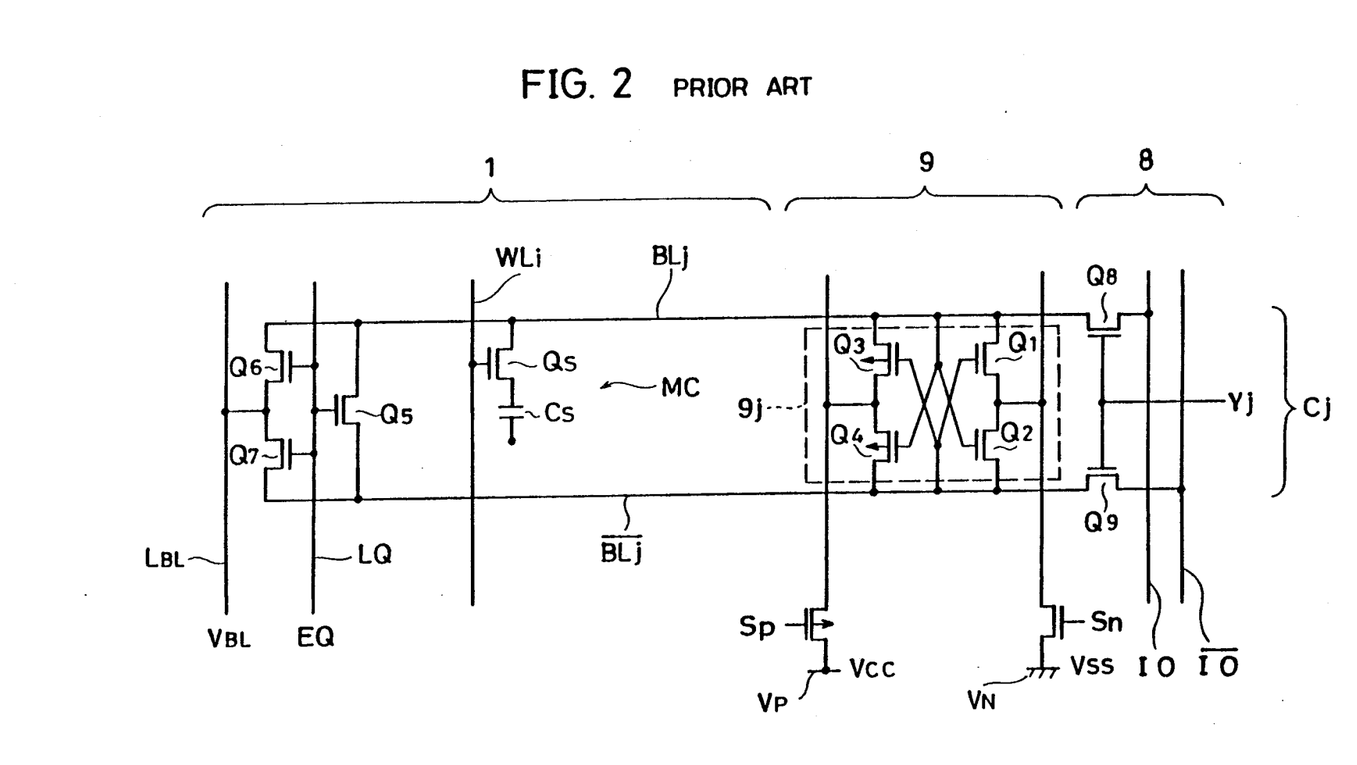
FIG. 2 is a circuit diagram of one column in a conventional DRAM.

FIG. 2 is a circuit diagram of one column in a conventional DRAM. Referring to FIG. 2, the jth column Cj includes memory cells MC (only one is shown) connected between bit lines BLj and $\overline{BLj}$ and a sense amplifier 9j. Sense amplifier 9j includes NMOS transistors Q1 and Q2 and PMOS transistors Q3 and Q4. An NMOS transistor Q8 is connected between bit line BLj and an IO line. An NMOS transistor Q9 is connected between bit line $\overline{BLj}$ and a $\overline{IO}$ line. Transistors Q8 and Q9 are turned on in response to a column selecting signal Yj generated from column decoder 6 illustrated in FIG. 1.

In the read operation, after an NMOS transistor Q5 ends equalizing of bit lines BLj, $\overline{BLj}$, the ith word line WLi is made to rise. A switching transistor Qs in memory cell MC is turned on, so that a small potential difference appears between bit lines BLj and $\overline{BLj}$. Sense amplifier 9j is activated in response to activating signals Sp and Sn, so that the small potential difference is amplified by sense amplifier 9j. Transistors Q8 and Q9 are turned on in response to the high level column selecting signal Yj, so that the amplified data signal is applied to the IO line pair. The data signal on the IO line pair is provided through data input/output circuit 10 illustrated in FIG. 1 to the outside.

In the write operation, a data signal Din to be stored is supplied through data input/output circuit 10 to the IO line pair. Transistors Q8 and Q9 are turned on in response to a high level column selecting signal Yj, so that the data signal is applied to bit line pair BLj, $\overline{BLj}$. A high level word line signal WLi is applied, so that transistor Qs in memory cell MC is turned on and the data signal is stored in a capacitor Cs. It is pointed out that column Cj to be accessed is selected by a column selecting signal Yj generated from column decoder 6 in both the read and write operation.

Figure 3:
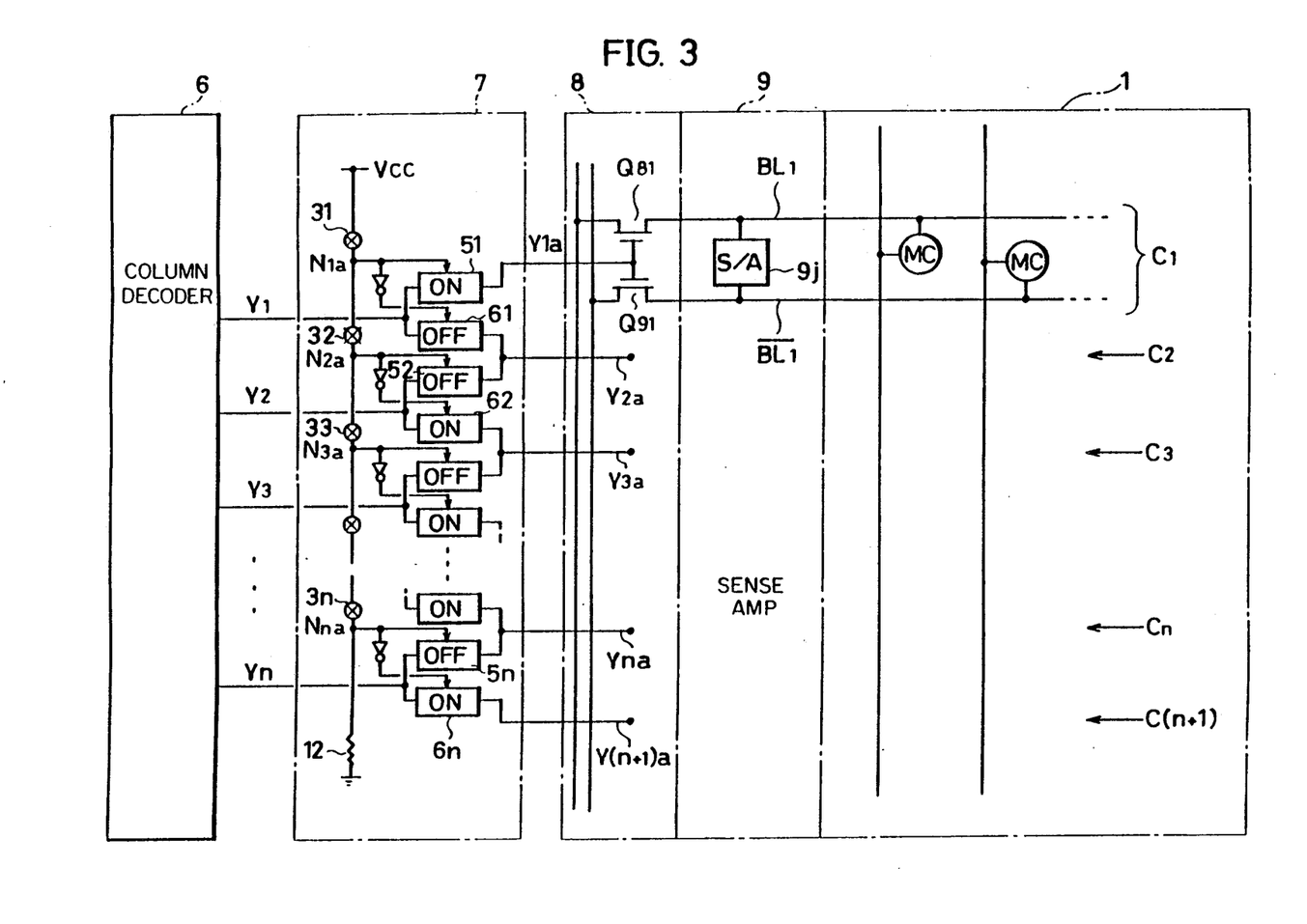
FIG. 3 is a circuit block diagram of the column repairing circuit illustrated in FIG. 1.

FIG. 3 is a circuit block diagram of column repairing circuit 7 illustrated in FIG. 1. Referring to FIG. 3, column repairing circuit 7 includes a fuse link including fuses 31 to 3n and a high resistor 12 connected in series between a supply potential Vcc and a ground potential, switching elements or circuits 51 to 5n on the upper side, and switching elements or circuits 61 to 6n on the lower side. Each of the pairs of switching elements or circuits on the upper and lower sides is controlled in response to the potentials at corresponding connection nodes N1a to Nna of corresponding two fuses. For example, switching circuit pair 51 and 61 for selecting a first column C1 is turned on and off in a complementary manner in response to a column selecting signal Y1 generated from column decoder 6 and the potential at node N1a.

Column decoder 6 includes column selecting signal lines Y1 to Yn for selecting a column to be accessed. Column decoder 6 selectively brings one of column selecting lines Y1 to Yn to a high level in response to an externally applied column address signal.

A column, for example the first column C1, includes column selecting gate transistors Q81 and Q91 connected between a bit line pair BL1, $\overline{BL1}$ and an IO line pair, a sense amplifier circuit 9j, and memory cells MC connected to bit lines $\overline{BL1}$, BL1. Transistors Q81 and Q91 operates in response to a column selecting signal Y1a supplied from column decoder 6 through column repairing circuit 7. In other words, reading or writing (i.e. accessing) from or into (to) the memory cells MC in the first column C1 is carried out in response to column selecting signal Y1a.

The respective circuits in the other columns C2 to C (n+1) have the same circuit configuration as that of the first column C1, so that illustration and description of them will be omitted.

Memory cell array 1 includes (n+1) columns C1 to C (n+1). Column decoder 6 includes n output signal lines Y1 to Yn, so that one of the (n+1) columns C1 to C (n+1), i.e. the one not fixed, functions as a redundancy circuit.

When there is no defective memory cell in all the columns C1 to C (n+1), no fuse in the fuse link is disconnected. Resistor 12 has a high resistance value, so that all of nodes N1a to Nna are made to attain a high potential, i.e. supply potential Vcc. Accordingly, switching elements or circuits 51 to 5n on the upper side are turned on, and switching elements or circuits 61 to 6n on the lower side are turned off. As a result, output signal lines Y1 to Yn of column decoder 6 are electrically connected through column repairing circuit 7 to column selecting lines Y1a to Yna, respectively.

In the case where there is a defective memory cell in any of the columns, for example, in the case where a defective memory cell is discovered in the second column C2, column repairing circuit 7 functions as described in the following. First, fuse 32 is disconnected in advance by a fuse melting apparatus. Accordingly, while node N1a is kept at a high potential, nodes N2a to Nna are changed to a low potential, i.e. the ground potential. Therefore, while switching circuits 51 and 61 in the first switching pair are turned on and off, respectively, the switching circuits on the upper and lower sides in each of the other switching pairs are turned off and on, respectively. As a result, output signal lines Y2 to Yn of column decoder 6 are connected through column repairing circuit 7 to column selecting lines Y3a to Y (n+1), respectively. Column selecting line Y2a is not electrically connected to any output signal line of column decoder 6, so that the second column C2 is not selected. In other words, accessing is not carried out to column C2 including a defective memory cell in the read and write operation.

Figure 4:
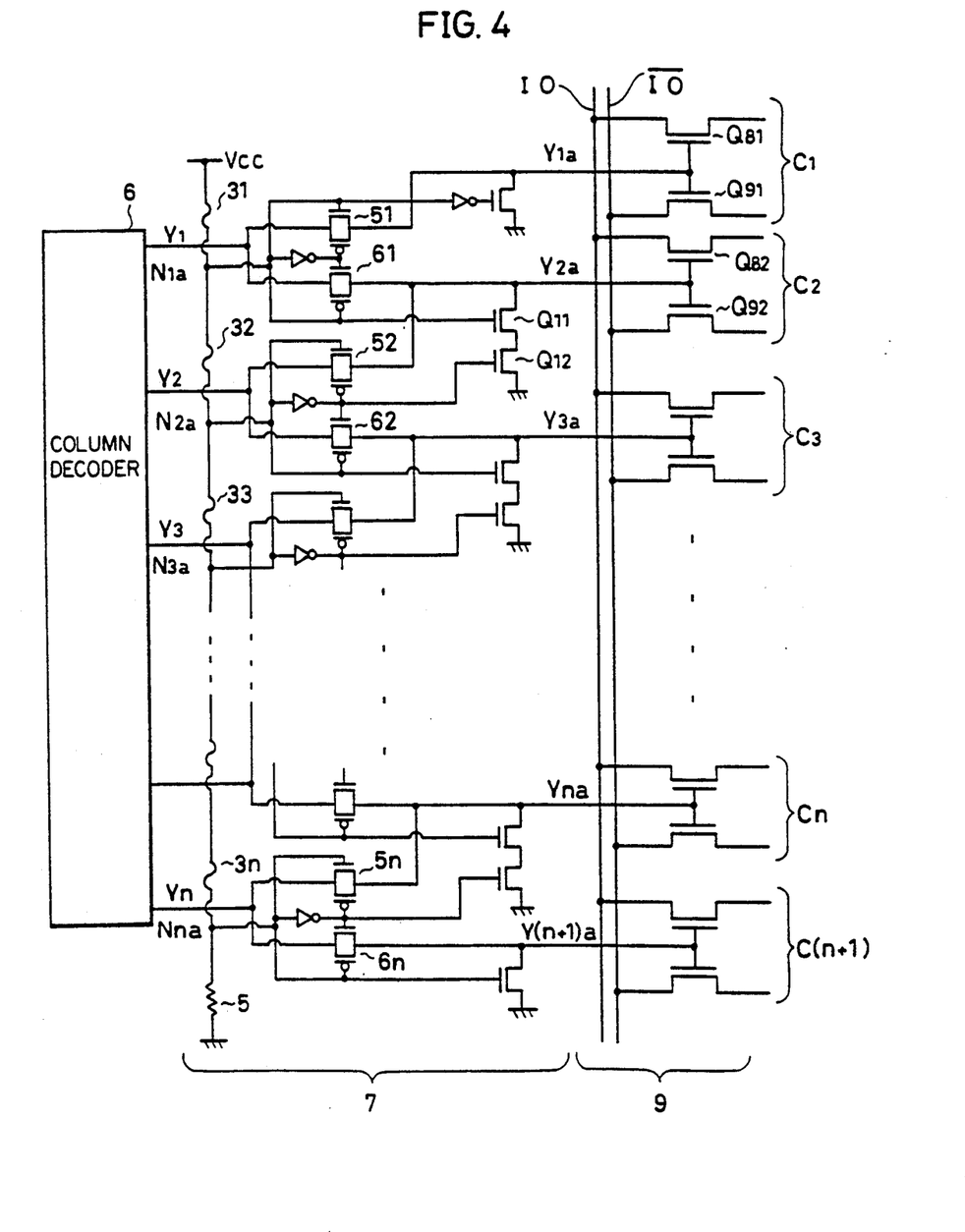
FIG. 4 is a circuit diagram of the column repairing circuit illustrated in FIG. 3.

FIG. 4 is a circuit diagram of column repairing circuit 7 illustrated in FIG. 3. Referring to FIG. 4, each of switching circuits 51 to 5n and 61 to 6n is implemented with a CMOS transmission gate. NMOS transistors for bringing the non-selected column selecting lines Y1a to Y (n+1) a to the ground potential are illustrated, while illustration of them is omitted in circuit 7 in FIG. 3. For example, NMOS transistors Q11 and Q12 are connected in series between column selecting line Y2a and ground. When there is a defective memory cell in column C2, column selecting line Y2a is not activated. Specifically, transmission gates 61 and 52 are turned off and transistors Q11 and Q12 are turned on, so that column selecting line Y2a is brought to the ground potential through transistors Q11 and Q12. As a result, transistors Q82 and Q92 in column C2 are completely turned off, so that false access to column C2 is prevented.

While column repairing circuit 7 used for column selection has been described above, it is pointed out that the row repairing circuit illustrated in FIG. 1 has the same circuit configuration. Specifically, when there is a defective memory cell in a row, row repairing circuit 4 electrically connects the output signal lines of row decoder 3 to the word lines except the defective row, respectively. It is pointed out that proposals with respect to row repairing circuit 4 are also made in the preceding two applications.

Problems as described in the following have arisen in the above column repairing circuit 7 (or row repairing circuit 4). First, column repairing circuit 7 illustrated in FIG. 3 is capable of repairing only one column (column C2 in the above example). In other words, when there are defective memory cells in more than two columns (or rows), it is not possible to repair the semiconductor memory by repairing circuit 7 (or 4).

The preceding application (Ser. No. 500,965) proposes providing two cascaded repairing circuits for repairing a semiconductor memory having more than two defective rows or columns. Specifically, two repairing circuits 7 as illustrated in FIG. 3 are cascaded, and it is made possible to repair two defective rows (or columns). However, cascading two circuits similar to circuit 7 in adjacent regions on a semiconductor substrate causes excessive concentration of fuses and switching elements or circuits. Specifically, a number of fuses are closely provided, so that it becomes difficult to disconnect with accuracy a desired fuse. In addition, a number of switching elements or circuits are closely provided, so that noise which is caused by switching tends to be generated. As a result, it is pointed out that providing more than two repairing circuits closely as illustrated in FIG. 3 should be avoided.

SUMMARY OF THE INVENTION

An object of the present invention is to repair a semiconductor memory device having more than two defective rows or columns.

Another object of the present invention is to prevent excessive concentration of fusible elements in a semiconductor memory device capable of repairing more than two defective rows or columns.

Still another object of the present invention is to prevent generation of noise in a semiconductor memory device capable of repairing more than two defective rows or columns.

To be brief, a semiconductor memory device according to the present invention includes first and second memory cell arrays each including a plurality of memory cells arranged in rows and columns. The first memory cell array includes at least (n+1) first column selecting lines for selecting memory cells arranged in corresponding columns, respectively. The second memory cell array includes at least (n+2) second column selecting lines for selecting memory cells arranged in corresponding columns, respectively. The semiconductor memory device further includes a column decoder having n output signal lines for selectively activating one of the n output signal lines in response to an externally applied column address signal, a first defining circuit for defining n column selecting lines which can be activated out of the at least (n+1) column selecting lines, a first connecting circuit connected between the n output signal lines of the column decoder and the at least (n+1) column selecting lines in the first memory cell array for connecting the n output signal lines of the column decoder to the n column selecting lines in the first memory cell array defined by the first defining circuit in one-to-one correspondence, a second defining circuit for defining n column selecting lines which can be activated out of the at least (n+2) column selecting lines in the second memory cell array, a second connecting circuit connected between the (n+1) column selecting lines in the first memory cell array and the at least (n+2) column selecting lines in the second memory cell array for connecting the column selecting lines in the first memory cell array connected to the column decoder by the first connecting circuit to the n column selecting lines in the second memory cell array defined by the second defining circuit in one-to-one correspondence.

In operation, when there is a defective column in the first memory cell array, the first connecting circuit prevents the defective column from being activated in accordance with the first defining circuit. In addition, when there is a defective column in the second memory cell array, the second connecting circuit prevents the defective column from being selected in accordance with the second defining circuit. Accordingly, it is possible to repair a semiconductor memory having two defective columns. It is also pointed out that the first and second defining circuits and the first and second connecting circuits are not closely provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
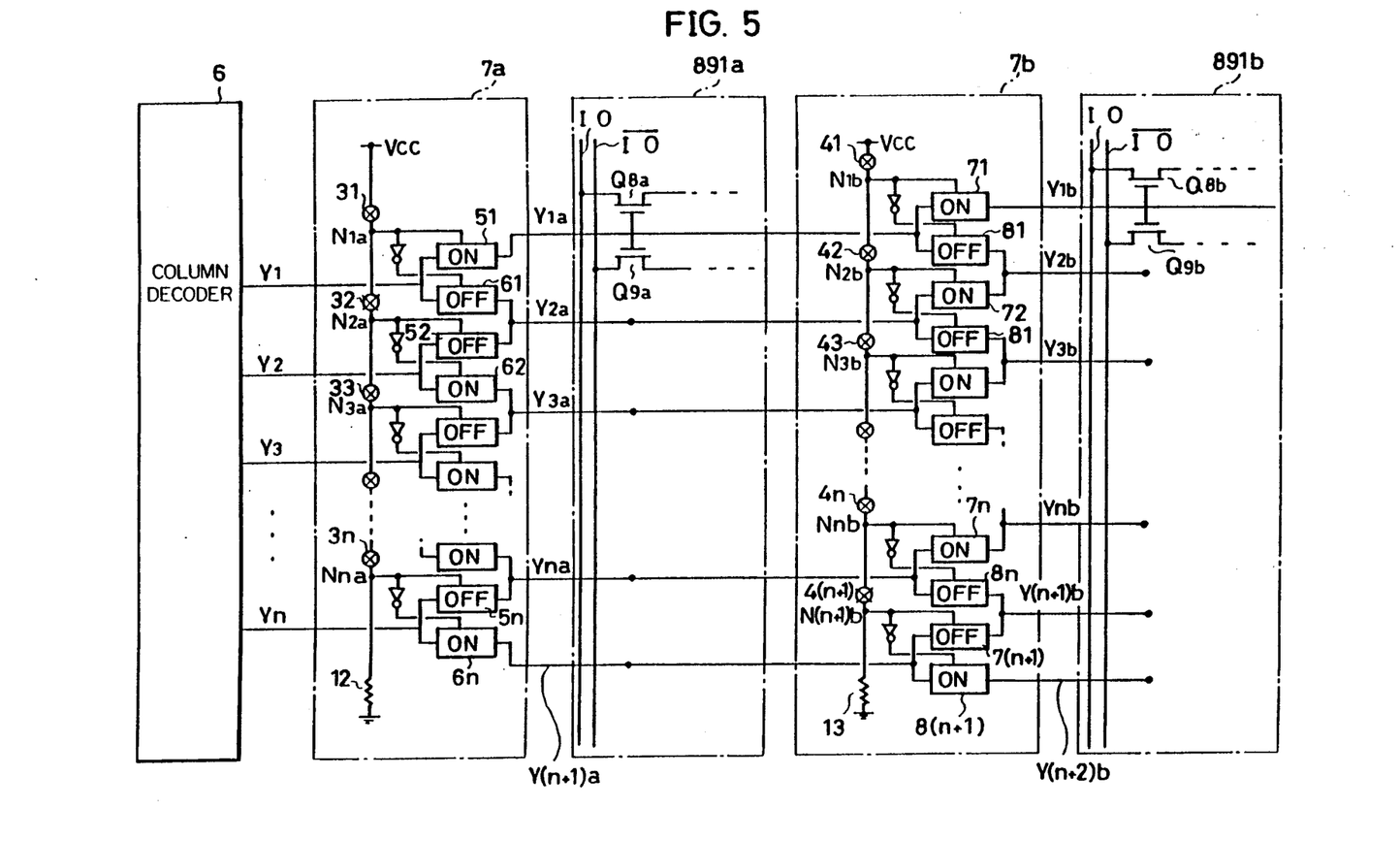
FIG. 5 is a circuit block diagram of column repairing circuits illustrating an embodiment of the present invention.

Referring to FIG. 5, a first column repairing circuit 7a is connected to output signal lines Y1 to Yn of a column decoder 6. First column repairing circuit 7a has the same circuit configuration as that of circuit 7 illustrated in FIG. 3. Circuits 8, 9, and 1 illustrated in FIG. 3 are divided into two circuit blocks 891a and 891b in FIG. 5. Each of circuit blocks 891a and 891b has a similar circuit configuration as those of circuits 8, 9, and 1 illustrated in FIG. 3 except that the number of memory cells included in it is reduced by half. First column repairing circuit 7a is connected to column selecting lines Y1a to Y (n+1) a provided in first memory array block 891a. In addition, first column repairing circuit 7a is connected through column selecting lines Y1a to Y (n+1) a to second column repairing circuit 7b. Second column repairing circuit 7b has a similar circuit configuration as that of circuit 7a except that it includes one more pair of switching elements or circuits.

Second column repairing circuit 7b includes fuses 41 to 4 (n+1) and a high resistor 13 connected in series between a supply potential Vcc and a ground potential, switching elements or circuits 71 to 7 (n+1) on the upper side, and switching elements or circuits 81 to 8 (n+1) on the lower side. Each pair of the switching elements or circuits on the upper and lower side is turned on and off in response to the potential at a corresponding node in the fuse link. Second memory array block 891b includes (n+2) column selecting lines Y1b to Y (n+2) b. Second column repairing circuit 7b is connected through column selecting lines Y1b to Y (n+2) b to second memory array block 891b.

In the case where there is no defective memory cell in memory array blocks 891a and 891b, none of fuses 31 to 3n and 41 to 4 (n+1) is disconnected. All of nodes N1a to Nna and N1b to N (n+1) b in the fuse link are maintained at the supply potential, so that all of the switching elements or circuits 51 to 5n and 71 to 7 (n+1) on the upper side are turned on. On the other hand, all of switching elements or circuits 61 to 6n and 81 to 8 (n+1) at the lower side are turned off. Accordingly, output signal lines Y1 to Yn of column decoder 6 are electrically connected through first column repairing circuit 7a to column selecting lines Y1a to Yna, respectively. In addition, column selecting lines Y1a to Yna in memory array block 891a are electrically connected through second column repairing circuit 7b to column selecting lines Y1b to Ynb in memory array block 891b, respectively. As a result, output signal lines Y1 to Yn of column decoder 6 are electrically connected through first and second column repairing circuits 7a and 7b to column selecting lines Y1a to Yna and Y1b to Ynb in memory array blocks 891a and 891b.

Accordingly, normal column selection can be carried out in the read and write operation. It is pointed out that column selecting line Y (n+1) a in memory array block 891a and column selecting lines Y (n+1) b and Y (n+2) b in memory array block 891b are not selected, i.e. not activated, in this case.

Now, operation in the case where there are two defective columns will be described. It is assumed that there is a defective memory cell in the second column in first memory array block 891a, and there is a defective memory cell in the (n+1) th column in second memory array block 891b in the following description. In this case, fuse 32 in circuit 7a and fuse 4 (n+1) in circuit 7b are disconnected by fuse melting apparatus. Accordingly, as illustrated in FIG. 5, the first switching pair has switching element or circuit 51 on the upper side turned on and switching element or circuit 61 turned off. On the other hand, the other switching pairs have switching elements or circuits 52 to 5n on the upper side turned off and switching elements or circuits 62 to 6n on the lower side turned on. Accordingly, output signal line Y1 of column decoder 6 is electrically connected through switching element or circuit 51 to column selecting line Y1a. Output signal lines Y2 to Yn are electrically connected to column selecting lines Y3a to Y (n+1) a, respectively. As a result, column selecting line Y2a in first memory array block 891a is not selected, i.e. not activated.

In second column repairing circuit 7b, the first to the nth switching pairs have switching elements or circuits 71 to 7n on the upper side turned on. On the other hand, the (n+1) th switching pair has switching element or circuit 7 (n+1) on the upper side turned off and switching element or circuit 8 (n+1) on the lower side turned on. As a result, column selecting line Y (n+1) b in memory array block 891b is not selected, i.e. not activated. Although column selecting line Y2a in first memory array block 891a is not activated, and column selecting line Y2b in second memory array block 891b is also not actually activated, as a whole, n column selecting lines (except Y2b and Y (n+1) b) in second memory array block 891b are activated.

Figure 10:
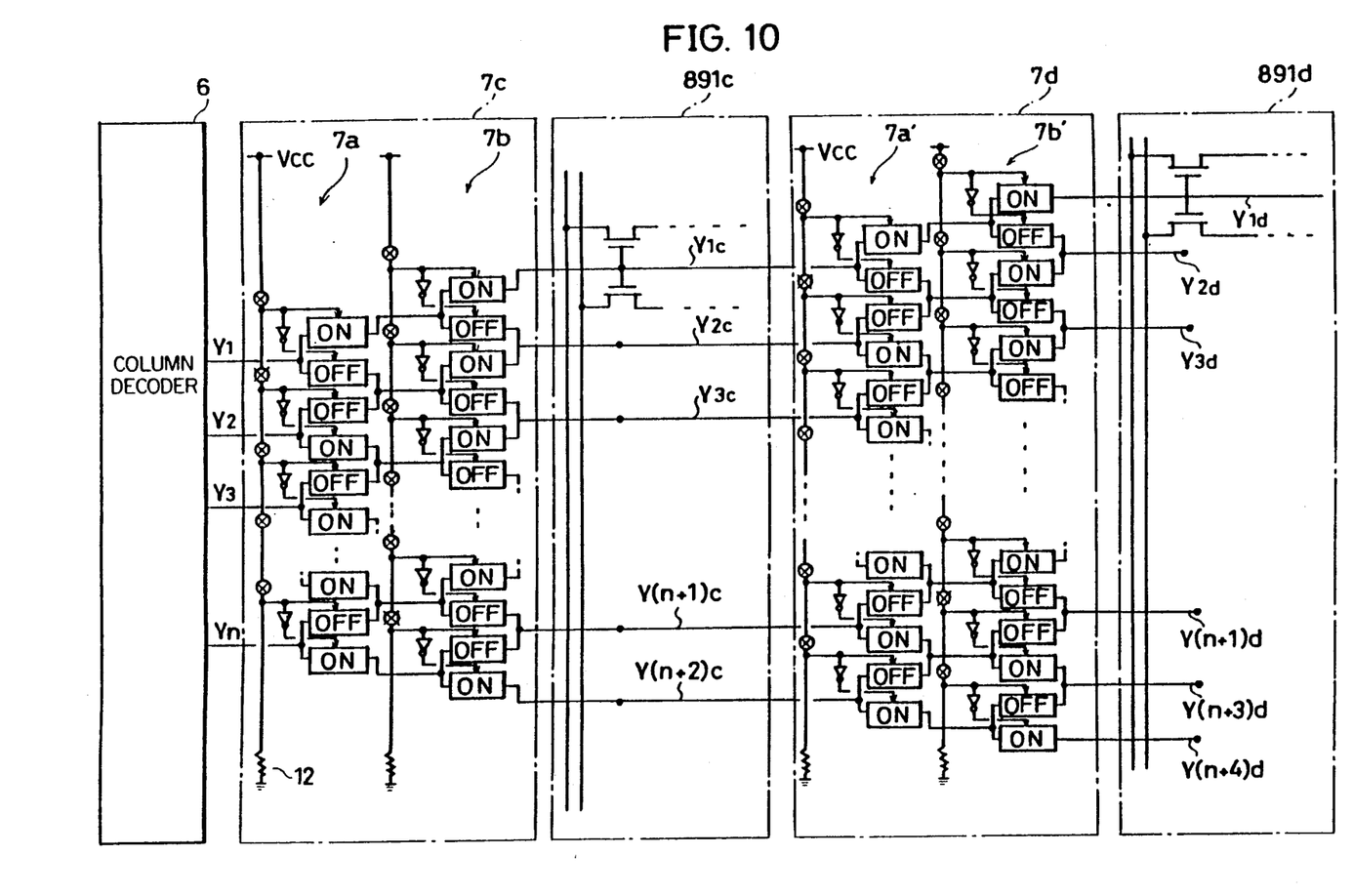
FIG. 10 is a circuit block diagram of column repairing circuits illustrating still another embodiment of the present invention.

Another embodiment according to the present invention is illustrated in FIG. 10. According to the example illustrated in FIG. 10, a maximum of four defective columns can be repaired. Referring to FIG. 10, a first column repairing circuit 7c includes repairing circuits 7a and 7b illustrated in FIG. 5. Specifically, output signal lines of repairing circuit 7a in a preceding stage is directly connected to repairing circuit 7b in a succeeding stage. Circuit 7a in the preceding stage is connected to output signal lines Y1 to Yn in column decoder 6. First memory array block 891c includes (n+2) columns. Circuit 7b in the succeeding stage is connected to column selecting lines Y1c to Y (n+2) c in first memory array block 891c.

Second column repairing circuit 7d includes a circuit 7a' in a preceding stage and a circuit 7b' in a succeeding stage. The number of switching pairs in circuit 7a' in the preceding stage is made larger than that of circuit 7b in the succeeding stage in first column repairing circuit 7c by one. On the other hand, the number of switching pairs in circuit 7b, in the succeeding stage is made larger than that of circuit 7a' in the preceding stage by one. Accordingly, circuit 7a' in the preceding stage is connected to column selecting lines Y1c to Y (n+2) c in memory array block 891c. Circuit 7b, in the succeeding stage is connected to column selecting lines Y1d to Y (n+4) d in second memory array block 891d.

Operation in the case where there are four defective columns in memory array blocks 891c and 891d will be described in the following. First, it is assumed that there are defective memory cells respectively in the second and the (n+1) th columns in memory array block 891c, and there are defective memory cells respectively in the second and the (n+1) th columns in memory array block 891d. Particular fuses in the four fuse links are disconnected as illustrated in FIG. 10, so that column selecting line Y2c, Y (n+1) c, Y2d and Y (n+1) d are not activated. As a result, even if there are four defective columns or memory cells in a DRAM, it is possible to repair the DRAM.

According to the embodiments illustrated in FIGS. 5 and 10, for example, the jth column selecting line is connected to line Yj in the circuit illustrated in FIG. 2. It is also possible to connect the column selecting line to the circuits illustrated in FIGS. 6 and 7 as another example of the circuit illustrated in FIG. 2.

Figure 6:
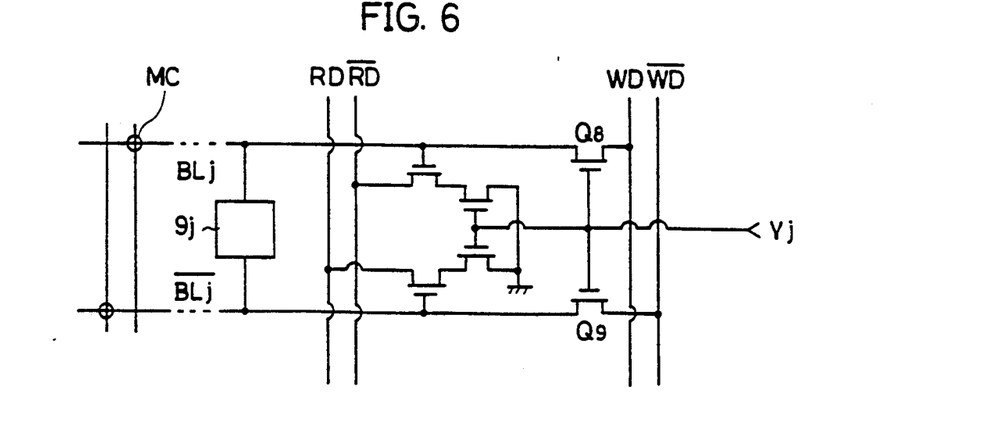
FIG. 6 is a circuit diagram illustrating another example for column selection.

The circuit illustrated in FIG. 6 includes two data line pairs RD, $\overline{RD}$ and WD, $\overline{WD}$ for reading and writing. Read data lines RD and $\overline{RD}$ are coupled respectively to bit lines $\overline{BL}j$ and BLj. Write data lines WD and $\overline{WD}$ are coupled respectively to bit lines BLj and $\overline{BL}j$. It is pointed out that the connections between data lines RD, $\overline{RD}$, WD and $\overline{WD}$ and bit lines BLj, $\overline{BL}j$ are controlled by a signal on column selecting line Yj.

Figure 7:
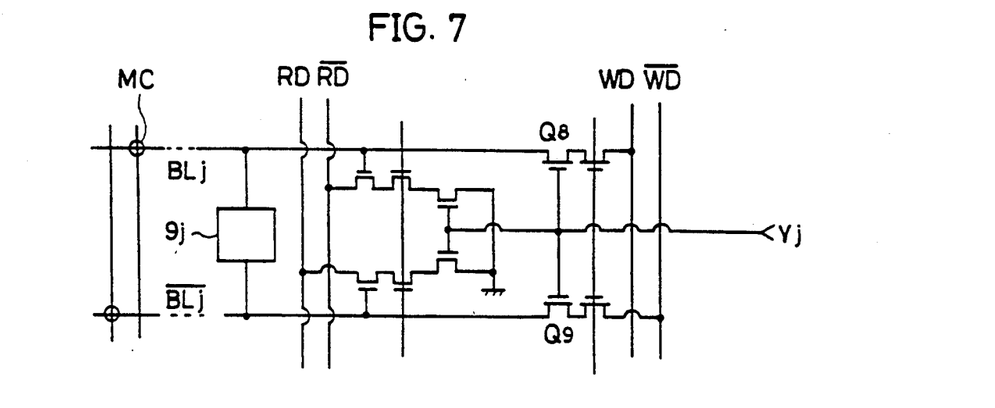
FIG. 7 is a circuit diagram illustrating still another example for column selection.

The circuit illustrated in FIG. 7 includes transistors for block selection in addition to the circuit illustrated in FIG. 6. The added transistors are controlled in response to block selecting signals RA9 and $\overline{RA9}$.

Figure 8:
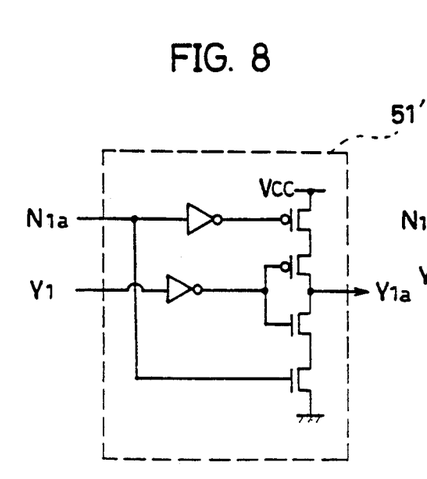
FIG. 8 is a circuit diagram illustrating another example of the switching circuit illustrated in FIG. 5.
Figure 9:
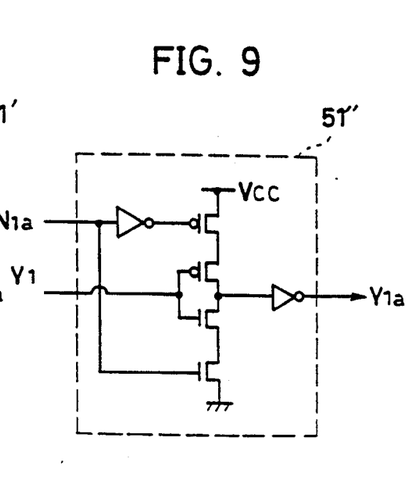
FIG. 9 is a circuit diagram illustrating still another example of the switching circuit illustrated in FIG. 5.

While transmission gate 51 illustrated in FIG. 4 is applied as each switching element or circuit in the embodiments illustrated in FIGS. 5 and 10, switching circuits 51' and 51" illustrated in FIGS. 8 and 9 are also applicable. Switching circuit 51' or 51" illustrated in FIG. 8 or FIG. 9 can be applied as the switching circuit illustrated in FIG. 5 or FIG. 10.

Figure 11:
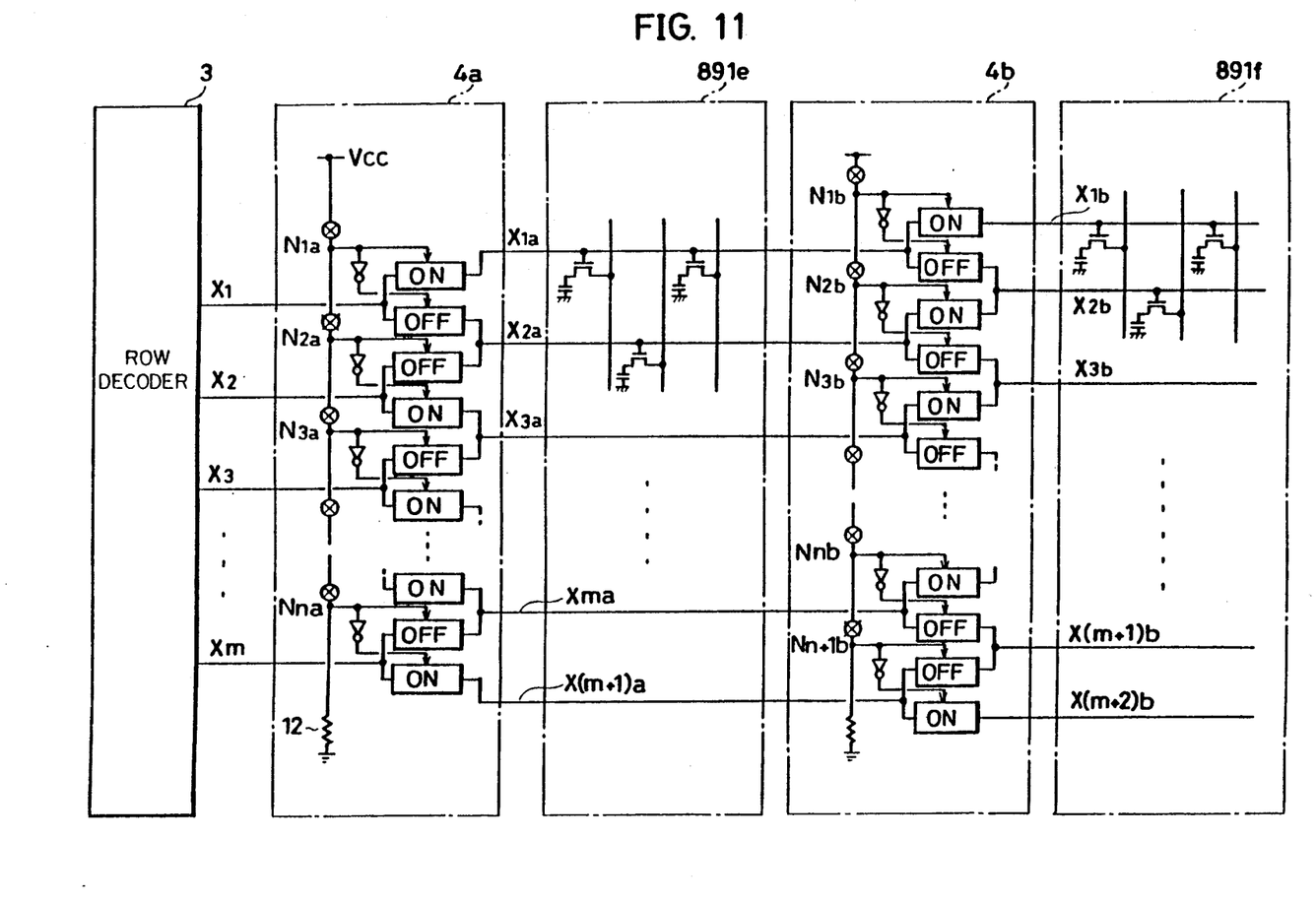
FIG. 11 is a circuit diagram of row repairing circuits illustrating a further embodiment of the present invention.

While the embodiments illustrated in FIGS. 5 and 10 include repairing circuits for defective columns in a DRAM, the present invention is also applicable to repairing circuits for defective rows in a DRAM. FIG. 11 is a circuit diagram of row repairing circuits in a DRAM. Referring to FIG. 11, row repairing circuits 4a and 4b have the same circuit configurations as those of column repairing circuits 7a and 7b illustrated in FIG. 5, respectively. However, row repairing circuits 4a and 4b are connected to word lines X1a to X (m+1) a and X1b to X (m+2) b of memory array blocks 891e and 891f, respectively. Accordingly, when there are defective memory cells in the second row in memory array block 891e and the (m+1) th row in memory array block 891f, it is possible to make word lines X2a and X (m+1) b not activated by disconnecting particular fuses in two fuse links as illustrated in FIG. 11. As a result, it becomes possible to repair a DRAM including two defective rows with row repairing circuits 4a and 4b.

While the case where the present invention is applied as repairing circuits for a DRAM is shown in the embodiments illustrated in FIGS. 5, 10, and 11, it is pointed out that application of the present invention is not limited to DRAMs and it is widely applicable to the other semiconductor memories such as SRAMs.

As described above, it is possible to repair a semiconductor memory including more than two defective columns or rows by providing the repairing circuits illustrated in FIGS. 5, 10, and 11 in a DRAM or other semiconductor memories. Repairing circuits 7a and 7b illustrated in FIG. 5 are formed spaced apart from each other on a semiconductor substrate, so that it is possible to prevent excessive concentration of fusible elements, i.e. fuses. In addition, excessive concentration of switching elements or circuits is also prevented, so that generation of unfavorable noise is prevented.

Although fuses and switching elements or circuits are concentrated in repairing circuits 7c and 7d illustrated in FIG. 10, it is possible to repair a semiconductor memory including four defective columns or rows if the degree of the concentration is not problematic in practice. It is pointed out that a semiconductor memory including a further larger number of defective columns or rows can be repaired by increasing the number of stages in the repairing circuits illustrated in FIG. 5 or FIG. 10 as required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    first and second memory cell arrays each including a plurality of memory cells arranged in rows and columns;
    said first memory cell array including at least (n+1) first array column selecting lines for selecting memory cells arranged in corresponding columns, respectively,
    said second memory cell array including at least (n+2) second array column selecting lines for selecting memory cells arranged in corresponding columns, respectively, and
    column decoder means, having n output signal lines, for selectively activating one of said n output signal lines in response to an externally applied column address signal;
    first defining means for defining n column selecting lines which are activated out of said at least (n+1) column selecting lines in said first memory cell array;
    first connecting means, connected between the n output signal lines of said column decoder means and said at least (n+1) column selecting lines in said first memory cell array, connecting the n output signal lines of said column decoder means to the n column selecting lines in said first memory cell array defined by said first defining means in one-to-one correspondence;
    second defining means for defining n column selecting lines which can be activated out of said at least (n+2) column selecting lines in said second memory cell array; and
    second connecting means, connected between the (n+1) column selecting lines in said first memory cell array and said at least (n+2) column selecting lines in said second memory cell array, connecting the n column selecting lines in said first memory cell array connected to said column decoder means by said first connecting means to the n column selecting lines in said second memory cell array defined by said second defining means in one-to-one correspondence.

2. The semiconductor memory device according to claim 1, wherein
    said first defining means includes a plurality of first fusible elements connected in series between first and second potential sources,
    said first connecting means operates in accordance with output voltages provided through connection nodes of said first fusible elements,
    said second defining means includes a plurality of second fusible elements connected in series between said first and second potential sources, and
    said second connecting means operates in accordance with output voltages provided through connection nodes of said second fusible elements.

3. The semiconductor memory device according to claim 1, wherein
    said first connecting means includes n first switching means, each connected to a corresponding one of the output signal lines of said column decoder means and each being selectively connected to one of two corresponding adjacent column selecting lines in said first memory cell array,
    when there is a faulty bit, said first defining means divides said n first switching means into at least first and second groups with respect to an output signal line of the column decoder means corresponding to the column selecting line which includes the faulty bit, and defines the connection manner of said n first switching means so that the connection manner of said n first switching means so that the connection manner of the switching means belonging to the first group and the connection manner of the switching means belonging to the second group are opposite,
    said second connecting means includes (n+1) second switching means, each connected to a corresponding one of the column selecting lines in said first memory cell array and each being selectively connected to one of two corresponding adjacent column selecting lines in said second memory cell array,
    when there is a faulty bit, said second defining means divides said (n+1) second switching means into at least first and second groups with respect to a column selecting line in said first memory cell array corresponding to the column selecting line which includes the faulty bit, and defines the connection manner of said (n+1) second switching means so that the connection manner of the switching means belonging to the first group and the connection manner of the switching means belonging to the second group are opposite.

4. The semiconductor memory device according to claim 1, wherein said first memory cell array further includes;
- at least (n+1) first bit lines each provided along a corresponding column and connected to memory cells arranged in said corresponding column,
- first data transmitting lines for transmitting a data signal, and
- at least (n+1) first switching means each connected between a corresponding first bit line and said first data transmitting lines and each being operated in response to a signal on a corresponding column selecting line, and wherein said second memory cell array further includes;
- at least (n+2) second bit lines each provided along a corresponding column and connected to memory cells arranged in said corresponding column,
- second data transmitting line for transmitting a data signal, and
- at least (n+2) second switching means each connected between a corresponding second bit line and said second data transmitting lines and each being operated in response to a signal on a corresponding column selecting line.

5. The semiconductor memory device according to claim 3, wherein
- each of said first switching means includes first and second switching elements having respective input terminals both connected to a corresponding one of the output signal lines of said column decoder means and turned on in a complementary manner to each other in accordance with said first defining means,
- said first switching element has its output terminal connected to one of said two corresponding adjacent column selecting lines in said first memory cell array,
- said second switching element has its output terminal connected to the other one of said corresponding adjacent two column selecting lines,
- each of said second switching means includes third and fourth switching elements having respective input terminals both connected to corresponding one of the column selecting lines in said first memory cell array and turned on in a complementary manner to each other in accordance with said second defining means,
- said third switching element has its output terminal connected to one of said two corresponding adjacent column selecting lines in said second memory cell array, and
- said fourth switching element has its output terminal connected to the other one of said corresponding adjacent two column selecting lines.

6. The semiconductor memory device according to claim 5, wherein each of said first switching means further includes driving capability increasing means, connected to said first and second switching elements, for increasing load driving capability of said first and second switching elements.

7. The semiconductor memory device according to claim 1, wherein said semiconductor memory device includes a dynamic random access memory (DRAM).

8. A semiconductor memory device, comprising:
- first and second memory ell arrays each including a plurality of memory cells arranged in rows and columns;
- said first memory cell array including at least (m+1) first array row selecting lines for selecting memory cells arranged in corresponding rows, respectively,
- said second memory cell array including at least (m+2) second array row selecting lines for selecting memory cells arranged in corresponding rows, respectively, and
- row decoder means, having m output signal lines, for selectively activating one of said m output signal lines in response to an externally applied row address signal;
- first defining means for defining m row selecting lines which are activated out of said at least (m+1) row selecting lines in said first memory cell array;
- first connecting means, connected between the m output signal lines of said row decoder means and said at least (m+1) row selecting lines in said first memory cell array, connecting the m output signal lines of said row decoder means to the m row selecting lines in said first memory cell array defined by said first defining means in one-to-one correspondence;
- second defining means for defining m row selecting lines which are activated out of said at least (m+2) row selecting lines in said second memory cell array; and
- second connecting means, connected between the (m+1) row selecting lines in said first memory cell array and said at least (m+2) selecting lines in said second memory cell array, connecting the m row selecting lines in said first memory cell array connected to said row decoder means by said first connecting means to the m row selecting lines in said second memory cell array defined by said second defining means in one-to-one correspondence.

9. The semiconductor memory device according to claim 8, wherein
- each of said at least (m+1) first row selecting lines includes at least (m+1) first word lines each connected to memory cells arranged in a corresponding row, and
- each of said at least (m+2) second row selecting lines includes at least (m+2) second word lines each connected to memory cells arranged in a corresponding row.

* * * * *